United States Patent [19]
Raaijmakers

[11] Patent Number: 5,827,408
[45] Date of Patent: Oct. 27, 1998

[54] METHOD AND APPARATUS FOR IMPROVING THE CONFORMALITY OF SPUTTER DEPOSITED FILMS

[75] Inventor: Ivo Raaijmakers, Phoenix, Ariz.

[73] Assignee: Applied Materials, Inc, Santa Clara, Calif.

[21] Appl. No.: 693,823

[22] Filed: Jul. 26, 1996

[51] Int. Cl.[6] .................................................. C23C 14/34
[52] U.S. Cl. .................................. 204/192.12; 204/192.3; 204/192.15; 204/298.06; 204/298.09; 204/298.11
[58] Field of Search .................. 204/192.15, 192.12, 204/192.3, 298.06, 298.07, 298.08, 298.11, 298.15, 298.33

[56] References Cited

U.S. PATENT DOCUMENTS

| | | | |
|---|---|---|---|
| 4,717,462 | 1/1988 | Homma et al. | 204/192.15 X |
| 4,824,544 | 4/1989 | Mikalesen et al. | 204/192.12 X |
| 4,849,081 | 7/1989 | Ross | 204/192.22 X |
| 4,994,162 | 2/1991 | Armstrong et al. | 204/192.12 X |
| 5,073,241 | 12/1991 | Watanabe | 204/192.15 |
| 5,108,570 | 4/1992 | Wang | 204/192.15 X |
| 5,122,249 | 6/1992 | Niemann et al. | 204/192.15 X |
| 5,294,320 | 3/1994 | Somekh et al. | 204/198.11 |
| 5,330,628 | 7/1994 | Demaray et al. | 204/192.12 |
| 5,358,616 | 10/1994 | Ward | 204/192.12 X |
| 5,380,414 | 1/1995 | Tepman | 204/192.12 X |
| 5,415,753 | 5/1995 | Hurwitt et al. | 204/192.12 |

OTHER PUBLICATIONS

Bourhila et al, "Thermodynamic and Experimental Study of Cu–LPCVD by Reduction of Copper Chloride", presented at Ad. Matellization Con. in Radebuel, GE, Mar. 19–22, 1995, 11 pages.

*Primary Examiner*—Nam Nguyen
*Attorney, Agent, or Firm*—Birgit E. Morris; Donald Verplancken

[57] ABSTRACT

A sputtering process is chemically enhanced to improve conformality of the sputter deposited film by adding a flow of a halogen-containing etch gas during sputter deposition. A reducing gas can be added near the substrate to aid in the deposition reaction. A physical vapor deposition chamber is modified to provide a reducing gas inlet near the substrate.

14 Claims, 1 Drawing Sheet

METHOD AND APPARATUS FOR IMPROVING THE CONFORMALITY OF SPUTTER DEPOSITED FILMS

This invention relates to an improved sputtering process and apparatus for the physical vapor deposition of metal or dielectric films. More particularly, this invention relates to a process and apparatus for depositing sputtered layers having improved conformality.

BACKGROUND OF THE INVENTION

Physical vapor deposition of pure metal films, such as aluminum, copper and titanium and alloys thereof, and the deposition of compounds such as titanium nitride, are conventional for depositing films in contact openings in a substrate for example. However, as the aspect ratio of such openings has increased, the sputter deposition of conformal layers of the deposited films becomes more difficult.

When high aspect ratio openings are to be filled using a physical vapor deposition process, the sticking coefficient of the sputtered particles is about one; that is, almost all of the sputtered particles stick where they impact the substrate. Since even when using a collimator sputtered particles impact the surface at a variety of polar angles, many particles impact the substrate at some angle other than 90° with respect to the surface of the substrate. This leads to a buildup of deposited material, particularly at the upper portion of the sidewalls of an opening, as shown in FIG. 1. Eventually the film closes the top of the opening and a void is left near the bottom of the opening, which is highly undesirable and may be unacceptable. Referring to FIG. 1, a substrate 12 has an opening 14 therein, partially filled with deposited material 16.

Depositing species in a chemical vapor deposition process can have a much lower sticking coefficient, on the order of $10^{-4}$ to $10^{-1}$. Thus for this method only a small percentage of the particles that reach the surfaces of the opening sidewalls stick there, and most of them bounce several times along the sidewalls, so that they eventually are able to reach the bottom of the opening. This is shown schematically in FIG. 2, which illustrates a substrate 12', an opening 14' and a coating 16' deposited in the opening 14'. This method fills an opening conformally, and, if the sticking coefficient is sufficiently low, without forming a void in the opening.

SUMMARY OF THE INVENTION

We have found that the conformality of sputter deposited films can be improved by chemical enhancement of the sputter deposition process. A chemically reactive gas, such as a halogen-containing gas, is added to the plasma in the physical vapor deposition chamber. Under certain conditions, this chemically reactive gas is believed to result in a partial etch of the sputtered film, which effectively lowers the sticking coefficient of the incoming sputtered particles, and leads to improved conformality of the sputtered film.

This regime, generally characterized by a low pressure, i.e., less than 100 millitorr (mT), and fairly high sputtering rates of over 1000 Å/min, is comparable to a conventional physical vapor deposition process with an etching component at the substrate. Under other conditions a chemical reaction close to the target surface is believed to generate volatile halogen-containing compounds. The reactions are believed to be reversed on the substrate and the target material is deposited on the substrate. This process is generally characterized by higher pressures, i.e. from 100 mT up to several Torr, and lower power on the sputtering target.

DETAILED DESCRIPTION OF THE INVENTION

In accordance with the present process, a halogen-containing gas, including fluorine-containing gases such as $NF_3$, hydrogen halides such as HCl, halogen gases such as $Cl_2$ and the like, is added to the physical vapor deposition chamber during sputtering of a film to form a conformal layer in a high aspect ratio opening.

Figure 1:
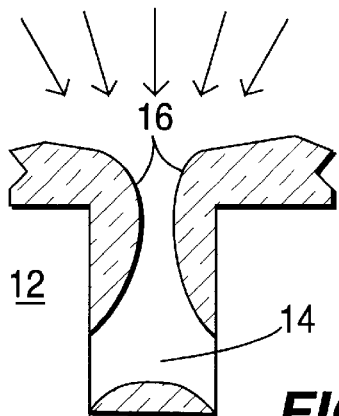
FIG. 1 is a cross sectional view of an opening to be filled by sputtering.
Figure 2:
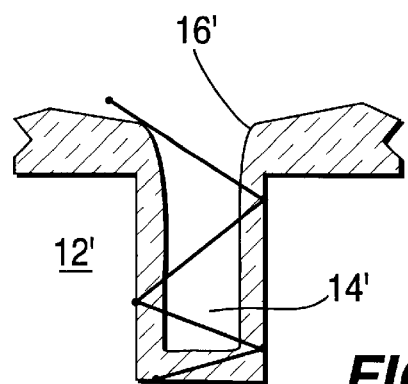
FIG. 2 is a cross sectional view of an opening to be filled by chemical vapor deposition.
Figure 3:
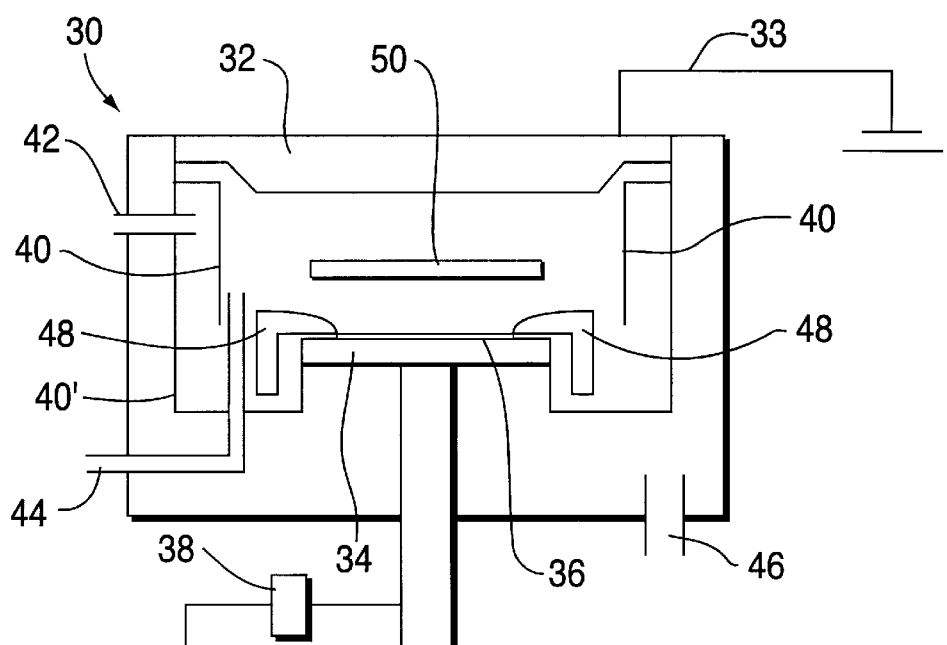
FIG. 3 is a schematic view of a physical vapor deposition chamber in which the present process can be carried out.

The present process can be carried out in a modified physical vapor deposition chamber 30 as shown in FIG. 3. The chamber 30 includes a water cooled target 32 of the material to be sputter deposited, which is connected to a source of power 33, such as a DC power supply. A substrate support electrode 34, opposite and spaced from the target 32, supports the substrate 36 to be coated and is connected to a source of power 38, such as an RF power supply in series with a capacitor. A shield 40 and 40' lines the inside walls of the chamber 30. The shield can be heated, either by connecting it to a resistance heater or by using radiant heating lamps (not shown). A gas inlet port 42 provides passage for the sputtering gas, e.g., argon, and the reactive halogen-containing gases. A second gas inlet port 44 can provide for supply of additional gases, including reducing gases such as hydrogen, ammonia or hydrazine, if needed for the reactions taking place near the substrate 36. An exhaust port 46 is connected to a vacuum pump (not shown) and provides exhaust of waste gases and control of the pressure inside the chamber 30. A chemical turbo pump is preferred to evacuate halogen-containing gases. For higher chamber operating pressures of over 10 mT, a rootsblower and mechanical pump are sufficient for pumping the process chamber. Generally the pressure is maintained below 1 torr, and preferably is maintained at a pressure of 0.1 torr or less.

A clamping ring 48 maintains the substrate 36 in position on the support electrode 34 during deposition processing. Backside argon can be used to thermally couple the substrate 36 to the support electrode 34. Alternatively, the electrode 34 can be equipped with an electrostatic chuck to clamp the substrate 36 to the support electrode 34. When the power on the support electrode 34 (RF) and/or the target 32 is turned on, a plasma can be formed from the precursor gases between the target 32 and the substrate 36. A DC (negative) voltage is applied to the target 32 during deposition.

If desired, the substrate 36 can be heated, as by providing a resistance heater in the substrate support electrode 34, or by heating the substrate support electrode 34 with a plurality of radiant energy lamps (not shown). Suitably the substrate can be heated up to about 500° C, preferably within the range 150–400° C. during deposition.

As an example of the present process, in a high pressure, chemical vapor deposition-like regime, a titanium target is provided in the sputtering chamber and a mixture of argon and for example HCl is passed into the chamber. The HCl concentration is preferably in the range of about 5–50 percent, although other compositions can be used. In this example, the following reactions are believed to take place in the sputtering chamber:

Close to the target, the halogen-containing gas attacks the sputtered target material, as shown in the equation 1) below:

$$Ti + x\ HCl \rightarrow TiCl_x + \tfrac{1}{2}H_2 \uparrow \qquad 1)$$

The rate of this reaction is determined by the concentration of the reactants and the power on the sputtering target. Preferably a power of between about 1 and 10 kW is used to achieve deposition rates of about 500–5000Å/min on a 200 mm diameter silicon wafer.

Close to the substrate, which may be heated to an appropriate temperature, the halogen-containing species is reacted, as with the dissociated hydrogen or additional reducing gas, to form a volatile halogen gas, i.e., HCl, which can be exhausted from the chamber through the exhaust system. The reduced target material then deposits on the substrate, as shown in equation 2).

$$TiCl_x + \tfrac{1}{2}xH_2 \rightarrow Ti + xHCl \uparrow \qquad 2)$$

When x is 4, the reaction 2) generally requires very high temperatures, on the order of 1000° C., but the present process occurs at much lower temperatures, about 200–400° C., which is advantageous. It is believed that the temperature of reaction (2) is low because of the formation of subchlorides (x<4) and plasma activation. The rate of the reaction is determined by the concentration of the reactant, and the RF power on the electrode. The concentration of reducing gas such as hydrogen can be enhanced near the substrate 36 by admitting additional hydrogen or other reducing gas close to the substrate surface through the second gas inlet 44.

HCl can be replaced with HF or other hydrogen halides, such as HI or HBr, to achieve similar results. Particularly interesting results can be obtained with $N_2/NF_3$ additions because the presence of the nitrogen will cause the Ti to react to form TiN on the substrate surface. This overall reaction is shown below:

$$Ti + NF_3 \rightarrow TiF_x + N_2 \rightarrow TiN + HF \qquad 3)$$

As in the previous case, the substrate must be heated to temperatures in the range of 200–500° C., and the target is water cooled. The pressure is generally in the range 0.1–10 Torr, preferably about 1 Torr.

The above reactions can also be carried out with other metals that form reasonably volatile halide compounds. Examples of suitable metals include Cu, Al, Mo, W, Ti, Ta, Si, Nb, V, Cr, Zr, Hf, Co and Ni and alloys thereof.

Although the chamber is illustrated as having a planar, large target mounted close to the substrate surface, e.g., within 5–20 cm, different arrangements are possible. In particular cases one may wish to further separate the target from the substrate to more easily drive the differences in chemical environment that cause the reaction equilibrium to proceed in the direction of volatile halides on one (target) end, and to metal at the substrate surface.

Another option is to install a collimator 50 between the target 32 and the substrate 36, as shown in FIG. 3, and to introduce the reactive gas into gas inlet 42 between the collimator 50 and the target 32, and to introduce the reducing gas into gas inlet 44 between the collimator 50 and the substrate 36.

Thus, to summarize, the addition of a halogen-containing gas to the sputtering gas in the higher pressure regime (<0.1 T) forms in a plasma a combination of sputtered material and metal halides which arrive at the surface of the substrate. At the substrate, the metal halides decompose, and the target material deposits on the substrate. The difference in surface temperature between the target and the substrate, and the different concentrations of reactants, drive the reaction towards formation of metal halides close to the target, and to metal atoms at the substrate surface. The reaction resembles a chemical vapor deposition process, but the precursor (metal halide) is formed in-situ, close to the target surface.

The exact nature of the reactions in the sputtering chamber also depend on the pressure inside the chamber. The above examples illustrate the reactions at high pressures, above about 0.1 Torr, preferably on the order of 1–10 torr, i.e., pressures typical of CVD processes. At lower pressures however, i.e., about 0.1 Torr, the addition of the halogen-containing gas is found to result in a simultaneous etching reaction at the substrate surface. The plasma dissociates the halogen-containing gas into active radicals. These radicals react with the growing film to form volatile metal halides, which can re-evaporate from the growing film. This will effectively decrease the sticking coefficient. The etching reaction is found to be most rapid where the film is growing the most rapidly, i.e., close to the top corners of the opening to be filled. The faster etching in those regions will prevent the growing film from closing the opening close to its top corner, thus permitting void-free filling of the opening. The rate of the etching reaction relative to the deposition rate can be controlled by the concentration of the halogen-containing gas, by the RF power supplied to the substrate support electrode, and by the substrate temperature.

In this regime, the concentration of halogen-containing gas can be much smaller than the previously described high pressure regime. Generally the concentration of halogen-containing gas in the argon working gas is less than 10%, preferably in the range of 0.1 to 5%.

As an example, the deposition of aluminum resulting in a complete fill of an opening at low temperatures will be described. A target of Al, or of Al alloy containing 0.5% Cu, is used to sputter Al onto the substrate surface. The preferred pressure is about 2 millitorr (mT), but a pressure within the range of 0.5–10 mT can be used. The argon sputtering gas is mixed with about 1% of chlorine, but concentrations of chlorine can vary within the range 0.1–5%. The growing Al film on the substrate is etched according to the following reaction:

$$2Al + 3Cl_2 \rightarrow 2AlCl_3 \qquad 4)$$

The $AlCl_3$ is a volatile Al compound and will desorb from the growing film at temperatures in excess of about 150° C. It is not required to supply RF power to the substrate support electrode in general, but in specific cases it may be desirable to enhance the etching reaction at the substrate surface by applying some RF power to the substrate support electrode. Frequencies of from 100 kHz to 27 MHz can be employed, although a frequency of 13.56 MHz is most commonly used. The application of RF power is believed to enhance the etching reaction by generating additional reactive chlorine radicals close to the substrate surface, and by inducing a negative bias on the substrate, which results in concurrent ion bombardment.

The etching reaction, concurrent with metal deposition, is equivalent to a deposition process with a species having a reduced sticking coefficient. As described above, this will permit void-free fill of an opening.

After the opening is filled with metal, Al in the above example, the remainder of the required metal film may be deposited without the chemical component. This will enhance the deposition rate, and thus the throughput of the chamber. This can be achieved by stopping the flow of the halogen-containing gas after the opening is filled.

An additional advantage to the present process is that the process can be made self-cleaning. During normal sputtering depositions, the target material deposits not only on the substrate, but also on surfaces surrounding the substrate, particularly the walls of the chamber and the shield that surrounds the target. As the sputtered material builds up on these surfaces, since the fixtures are subject to thermal cycling and stress, the films crack and form particles in the chamber, which is intolerable for modern day semiconductor processing. Thus these surfaces must be cleaned periodically to remove this deposit, sometimes after every deposition. By heating the shields to a sufficiently high temperature however, the halogen-containing gas may react so that the net deposition rate is close to zero, with the result that very little or no material is deposited on the shields. However, since the substrate may be maintained at a different, preferably lower, temperature than the shields, the target material continues to deposit on the substrate. Thus the downtime required for cleaning the sputter chamber and shields can be reduced, improving the economics of the process.

Figure 4:
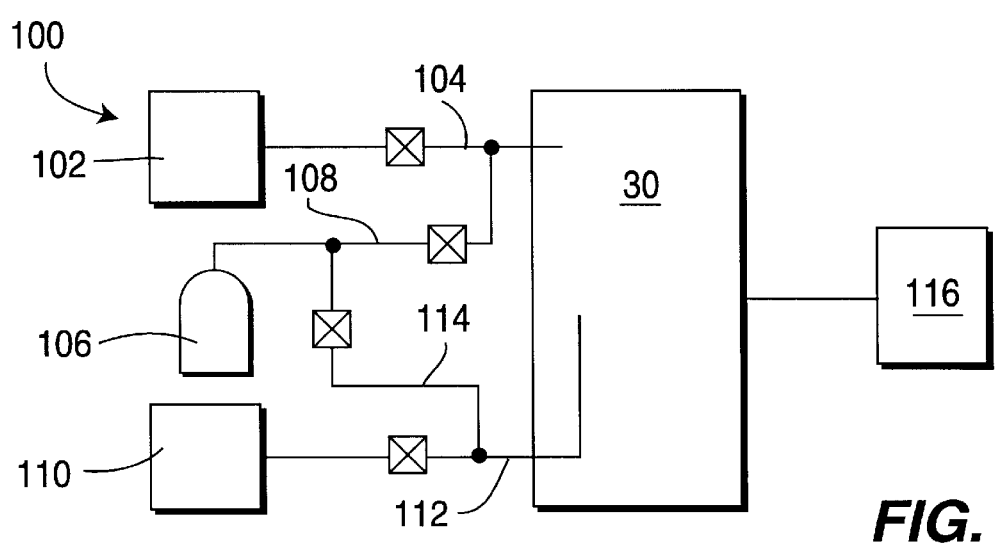
FIG. 4 is a schematic view of a system in which the present process can be carried out.

FIG. 4 is a schematic view of a system 100 in which the present process can be carried out. A source of halogen-containing gas 102 is connected through a line 104 to the chamber 30. A source of noble gas 106 is also connected to line 104 via line 108 or line 114. A source of reducing gas 110 is connected to the chamber 30 via line 112. A computer 116 is electrically connected to the chamber 30 to monitor the various gas flow rates.

Although the invention has been described in terms of specific embodiments, various other materials, pressures, temperatures can be substituted as will be known to those skilled in the art, and are meant to be included herein. The scope of the invention is only meant to be limited by the scope of the appended claims.

We claim:

1. A method of filling openings in a substrate having a plurality of openings therein comprising
   a) passing a mixture of argon and up to 10% by volume of a halogen-containing gas into a physical vapor deposition chamber adjacent to a target electrode while maintaining the pressure in the chamber below about 0.1 Torr;
   b) activating the target electrode and heating a substrate support electrode to a temperature of at least 150° C., thereby forming volatile halides of the material of the target and sputtering target material onto the substrate;
   c) etching a portion of said target material in said openings with said volatile halides while continuing to deposit target material, thereby filling said openings from the bottom of the openings.

2. A method according to claim 1 wherein said target is made of an aluminum-containing metal.

3. A method according to claim 1 wherein the pressure in the chamber is maintained between 0.5 to 10 millitorr.

4. A method according to claim 1 wherein the support electrode is connected to a source of RF power.

5. A sputter deposition process comprising
   a) sputtering a metal target in a physical vapor deposition chamber with a noble gas mixed with from 5–50% by volume of a halogen-containing gas at a pressure of at least 0.1 Torr to form a metal halide near the target,
   b) heating a substrate mounted on a substrate support electrode mounted opposite and spaced from said target up to a temperature of 500° C.;
   c) passing a reducing gas into the chamber adjacent to a substrate support to form a volatile hydrogen halide and deposit particles including the target metal on the substrate.

6. A process according to claim 5 wherein the pressure in the chamber is from 1–10 Torr.

7. A process according to claim 6 wherein the halogen-containing gas is a mixture of $NF_3$ and nitrogen and the deposited material is titanium nitride.

8. A process according to claim 5 wherein the target is titanium.

9. A process according to claim 5 wherein said reducing gas is hydrogen.

10. A physical vapor deposition chamber comprising
    a) a water cooled target electrode connected to a source of DC power;
    b) a substrate support electrode opposite and spaced from said target connected to a source of RF power;
    c) a shield mounted between said target electrode and said substrate support electrode and having a heater;
    d) a first gas inlet adjacent to the target for passing argon and a reactive halogen-containing gas into the chamber;
    e) a second gas inlet adjacent to the substrate support for passing a reducing gas into the chamber.

11. A chamber according to claim 10 including a source of argon gas in the support electrode that can pass between the support electrode and a substrate mounted thereon.

12. A chamber according to claim 10 including a heater for the support electrode.

13. A chamber according to claim 10 including a collimator mounted between the target and the substrate support, the first gas inlet is mounted between the target and the collimator and the second gas inlet is mounted between the collimator and the substrate support.

14. A chamber according to claim 13 wherein said collimator is heated to a temperature of from 150 to 500° C.

* * * * *